United States Patent [19]

Hembree

[11] Patent Number: 5,012,664
[45] Date of Patent: May 7, 1991

[54] PROGRESSIVE FORM DIE

[75] Inventor: David R. Hembree, Boise, Id.

[73] Assignee: Micron Technology, Inc., Boise, Id.

[21] Appl. No.: 472,253

[22] Filed: Jan. 30, 1990

Related U.S. Application Data

[63] Continuation-in-part of Ser. No. 282,517, Dec. 12, 1990, abandoned.

[51] Int. Cl.⁵ .................. H01R 43/00; B21F 1/00
[52] U.S. Cl. ................................ 72/404; 72/414; 72/381; 72/307; 72/323; 140/105; 29/882
[58] Field of Search ............... 72/404, 403, 414, 356, 72/381, 382, 384, 385, 306, 307, 323; 140/105; 29/882, 874

[56] References Cited

U.S. PATENT DOCUMENTS

| | | | |
|---|---|---|---|
| 2,834,393 | 5/1958 | Cihlar | 29/874 |
| 3,117,472 | 1/1964 | Mingus | 72/335 |
| 3,177,692 | 4/1965 | Stephens | 72/323 |
| 3,416,348 | 12/1968 | Carter | 72/381 |
| 3,788,118 | 1/1974 | Joseph | 72/331 |
| 4,027,521 | 6/1977 | McKee | 72/404 |
| 4,205,548 | 6/1980 | Bothner | 72/404 |
| 4,553,420 | 11/1985 | Fierkens | 72/380 |

FOREIGN PATENT DOCUMENTS 108919 5/1988 Japan .................. 140/105

OTHER PUBLICATIONS

Hastede, R. G., et al., "Core Plane Terminal Forming Die" from *IBM Technical Disclosure Bulletin*, vol. 8, No. 9, Feb. 1966, pp. 1208, 1209.

Primary Examiner—Daniel C. Crane
Attorney, Agent, or Firm—Robert A. de Groot; Stephen A. Gratton

[57] ABSTRACT

An apparatus, and method of using the apparatus for forming multiple bends in the lead wires of a multiple lead integrated circuit package. The apparatus comprises cooperating first form punches which provide a first bend in the lead wires, and a plurality of second form punches and anvils to provide a second bend in the lead wires. The lead wires are held by a clamp mechanism during the bending process so as to prevent damage to the package. The integrated circuit package is provided in a lead frame strip which is indexed through the apparatus so that a plurality of packages are worked at each of the three different positions. A misfeed mechanism is provided to shut down power to the device in the event of a misfeed.

11 Claims, 11 Drawing Sheets

PROGRESSIVE FORM DIE

This application is a continuation-in-part of application Ser. No. 282517, filed Dec. 12, 1990, now abandoned.

BACKGROUND OF THE INVENTION

This invention relates to a method and an apparatus useful to form the electrical lead wires of an integrated circuit package. Leads are usually wires rectangular in cross-section, which electrically connect an integrated circuit, encapsulated in a plastic or ceramic material, to a printed circuit board (PCB). The leads also physically attach the integrated circuit package to the PCB.

Economy of space is of critical importance when designing printed circuit boards for use in modern electronic apparatus, such as computers. Large quantities of dynamic random access memory (DRAM) devices are required by current computers, most of which are mounted on PCBs. To increase the density of DRAM devices on a PCB, zig-zag in-line packaging (ZIP) DRAM devices can be used, effectively doubling the memory density on a PCB, compared to conventional dual in-line packaged (DIP) DRAM devices.

ZIP device leads are formed with two bends. For instance, a 16 lead ZIP is manufactured with 16 co-planar leads emerging from one side of the device package. The first bend forms the leads at an acute angle to the original plane of the leads, while the second bend returns the distal portion of the lead to a plane parallel to the original plane of the leads. Heretofore, this double bend has been applied to the leads in a single operation by bending the leads with a punch against an anvil.

SUMMARY OF THE INVENTION

The apparatus of the present invention comprises cooperating die and punch assembly substructures. In a preferred embodiment, the die assembly is rigidly mounted to a base member, while the punch assembly is hydraulically activated between opened and closed positions. When in the open position, a lead frame having a plurality of zip devices with unformed leads interconnected, is indexed laterally between the die and punch assemblies.

Each of the die and punch assemblies are provided with cooperating clamps and punches which form the first bend in the lead wires. When the die and punch assemblies are closed the lead wire is securely held by the clamps and the first form punches form the first bend. The second bend in each lead wire is formed by a cooperating second form punch and second form anvil, in conjunction with a second form clamp. While any sequential configuration may be utilized, Applicant has found it advantageous to form all first bends (i.e. both odd and even leads) simultaneously, and, thereafter, form the second bends on one-half of the alternating leads (as, for instance, the odd leads) and, thereafter, in a third stage, form the second bend in the other alternating one-half (for instance, the even) leads.

Preferably, misfeed lead frame detection means are provided such that in the event the lead frame is improperly indexed and improperly located onto the die assembly, no damage to the integrated circuit packages and the various die components will occur since the misindexing detection system will not allow the punch and die assemblies to close together.

DETAILED DESCRIPTION OF THE INVENTION

Figure 1:
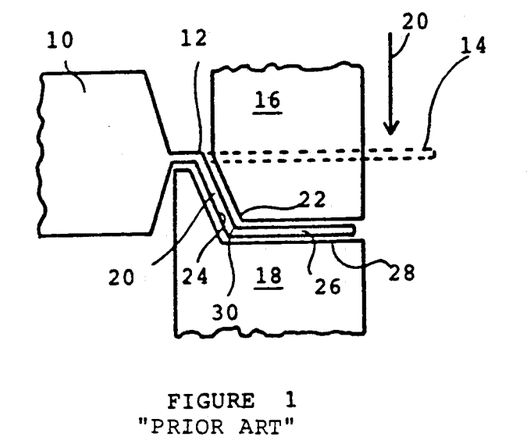
FIG. 1 is a schematic sectional view of the method and apparatus of the "PRIOR ART"

As shown in FIG. 1, the package 10 comprises a plurality of leads 12 aligned co-planar with one another, illustrated in their undeformed condition 14 in broken lines of FIG. 1. The process of the prior art comprises bringing a punch 16 into cooperating engagement with an anvil 18 by moving the punch in the direction of arrow 20. The lead wire 12 is therefore formed into its "double bend" configuration in a single step.

Because the integrated circuit packages are automatically inserted onto PCB's at high rates, it is critical that the lead "splay" (the relative position and the distance between adjacent leads) of the formed leads be consistent within tolerances of +/−0.006 inch. Such tolerances are difficult to maintain in high volume production by the one-step process of the prior art. The punch 16 deforms the lead 12 such that a first portion 20 of lead 12 is formed into the "first bend". The leading edge 22 of punch 16 forms the lead about the first face 24 of anvil 18. Further closure of the punch forms the second portion 26 of lead 12 on the second face 28 of anvil 18.

Two problems result from the prior art process set forth above. Because the leading edge 22 of punch 16 bears against the first portion 20 of lead 12 throughout the length of the first portion 20 during the downward travel of punch 16, metal is scraped from the first portion 20 and collects at the site 30 of the second bend. This results in non-uniform lead thickness at site 30, this non-uniformity of lead thickness at site 30 results in inconsistent lead splay, making automatic insertion of the package into a PCB more difficult.

A second problem associated with the lead bending process of the prior art is that the leading edge 22 of punch 16 becomes worn over a period of time and may not adequately coin the lead at the site 30 of the second bend, so that the angle of the second bend is not formed as precisely as required to be within the required tolerance.

Figure 2:
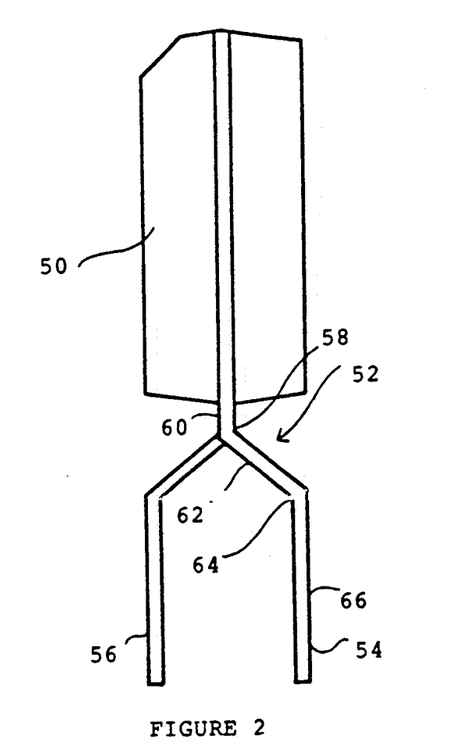
FIG. 2 is a side plan view of a ZIP package made according to the present invention.

Referring now to FIG. 2, the finished integrated circuit package of the present invention is provided with a body portion 50 of conventional manufacture (typically plastic or ceramic) and a plurality of leads 52. As illustrated, the ZIP package is provided with dual bend leads 54 and 56. The first bend occurs at a point 58 approximately 0.020 inch from the package body 50, leaving a first portion 60 in the original plane of the leads and a second portion 62 disposed at an acute angle to portion 60. As illustrated, the first bend is provided at an angle of about 51° to the original plane of the leads, although such angle may vary as required by the particular requirements. A second bend occurs at a point 64 approximately 0.060 inch from the package body 50, resulting in a third portion of the lead 66 disposed in a plane parallel to the original plane of the leads as defined by the first portion 60. It is to be understood that alternating ("odd" or "even") leads in the in-line lead package are bent either to the "left" or the "right".

Figure 3:
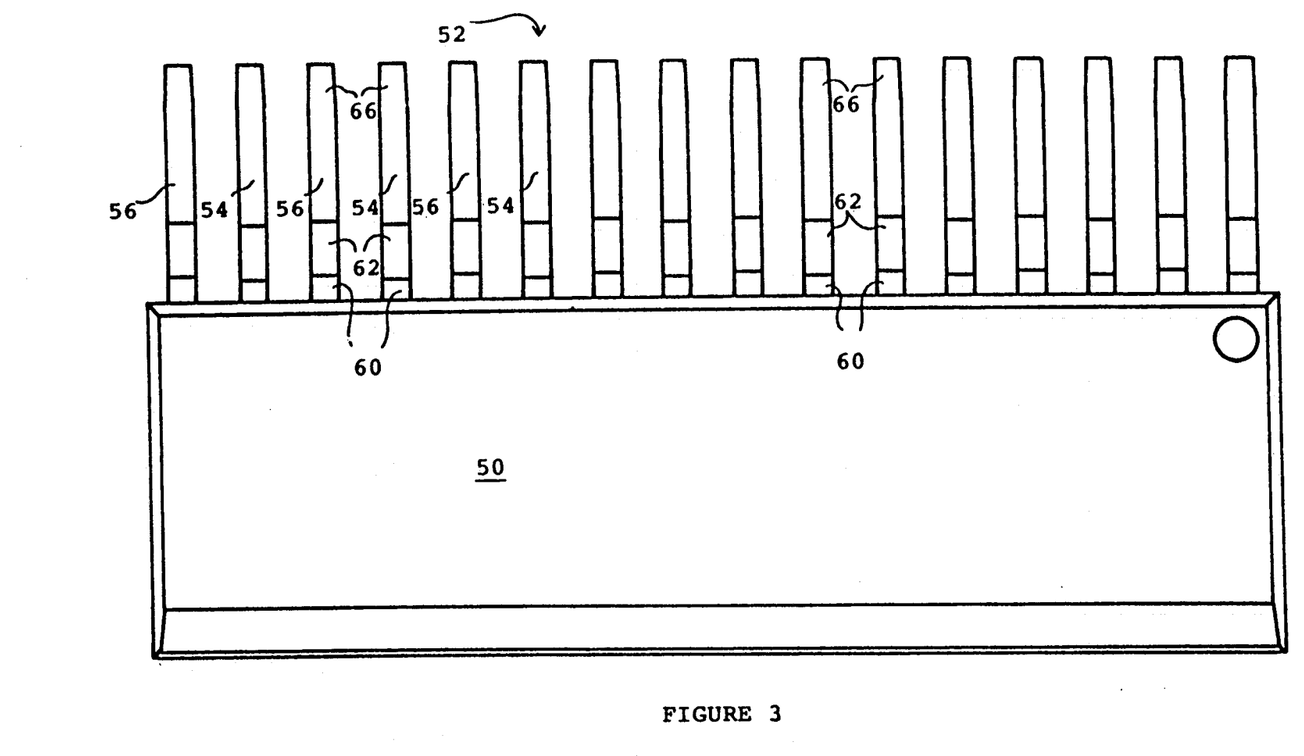
FIG. 3 is a top plan view of a ZIP package made according to the present invention.

As shown more fully in FIG. 3, a 16 lead ZIP package 50 comprises 16 leads 52 which alternate between "left" or "odd" leads 56 and "right" or "even" leads 54. The first, second and third portions, 60, 62 and 66 respectively, of the individual leads is shown in plan view.

The apparatus of the present invention comprises a die assembly and a punch assembly cooperating with one another to deform the leads therebetween. While the various parts of the die and punch assembly may be made of any commercially useful material, applicant has found that hardened steel is most desirable in view of the extreme stresses placed on the apparatus. As illustrated more specifically in FIG. 4, the die assembly, generally designated 70, comprises a base plate 72, a plurality of bushings 74 and a die holder chase 76. A plurality of die tooling 78 are retained within the chase 76 by a pair of plates 80, 82. The side plates 80, 82 are retained on the die holder chase 76 by a plurality of screws 84, while the die holder chase is secured to the base plate 72 by any convenient number of screws 86. At least two die stops 88 are affixed to the base plate and are provided with a tube spring 90 therein.

Figure 4:
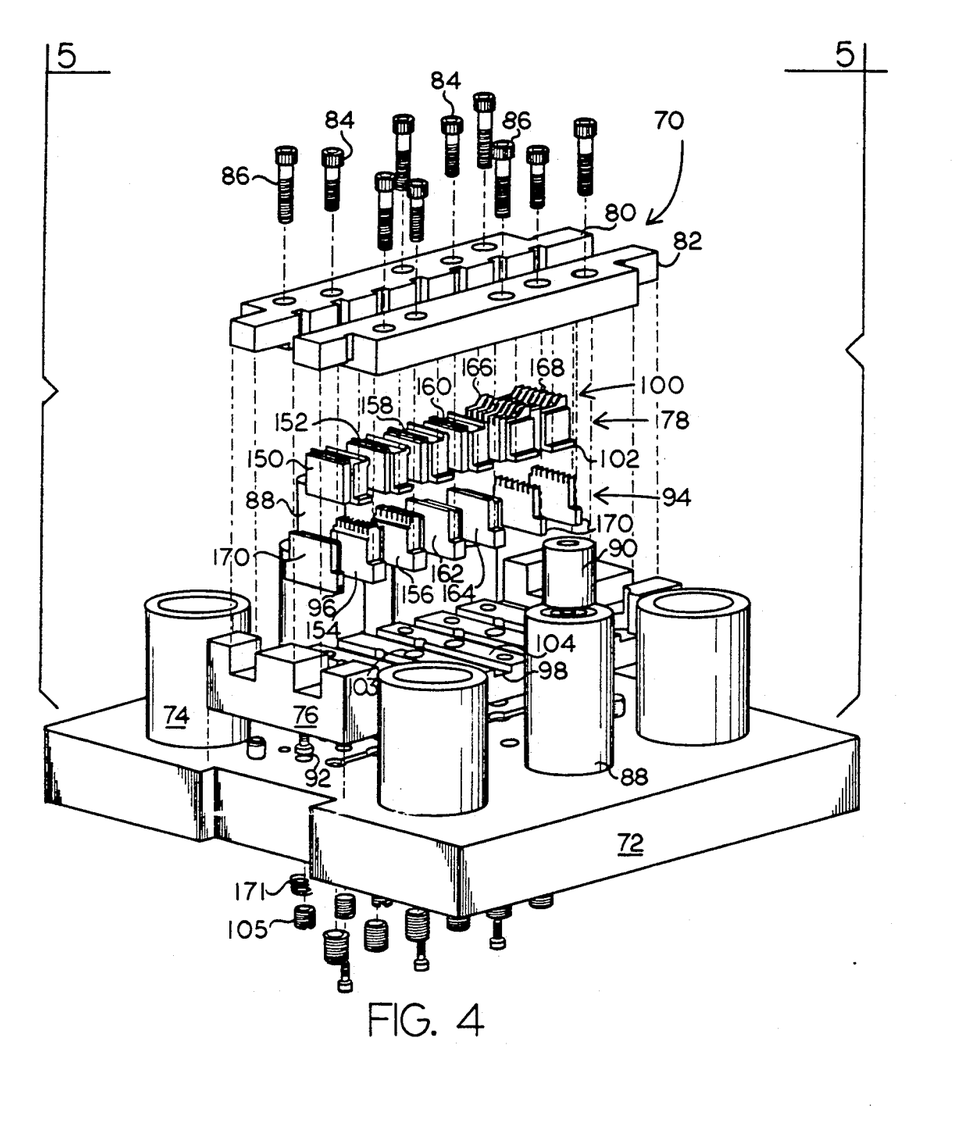
FIG. 4 is an isometric view of the die assembly of the present invention.

A plurality of misfeed sensor indexing pins 92 (in the illustrated embodiment, seven equally spaced pins are provided) are provided seated in the base plate and extending through the chase 76. Each of three misfeed sensor pins is spring-loaded by a coiled spring (not shown) beneath the pin and is provided with suitable electrical circuit contacting means so that when the pin is depressed, hydraulic power to the die assembly and punch assembly is cut off preventing further die and punch closure. The remaining four pins are used for indexing the lead frame.

Alternating individual die 94 (the "odd" numbered die positions 1, 3, 5, 7, 9, 11 and 13) are secured to the chase 76 by insertion of a hip 96 into a slot 98 milled in the surface of the chase 76. The other ("even" numbered positions) one-half of the alternating die 100 are provided with a base portion 102 which sets upon the surface 104 of the die chase 76. All of the die are retained upon the die chase by securing the die holder side plates 80, 82 about the die 78. The "even-numbered" die 100 are spring-loaded by springs located within six holes 103 (not shown) in the chase 76 which are adjustably tensioned by set screws 105.

Figure 5:
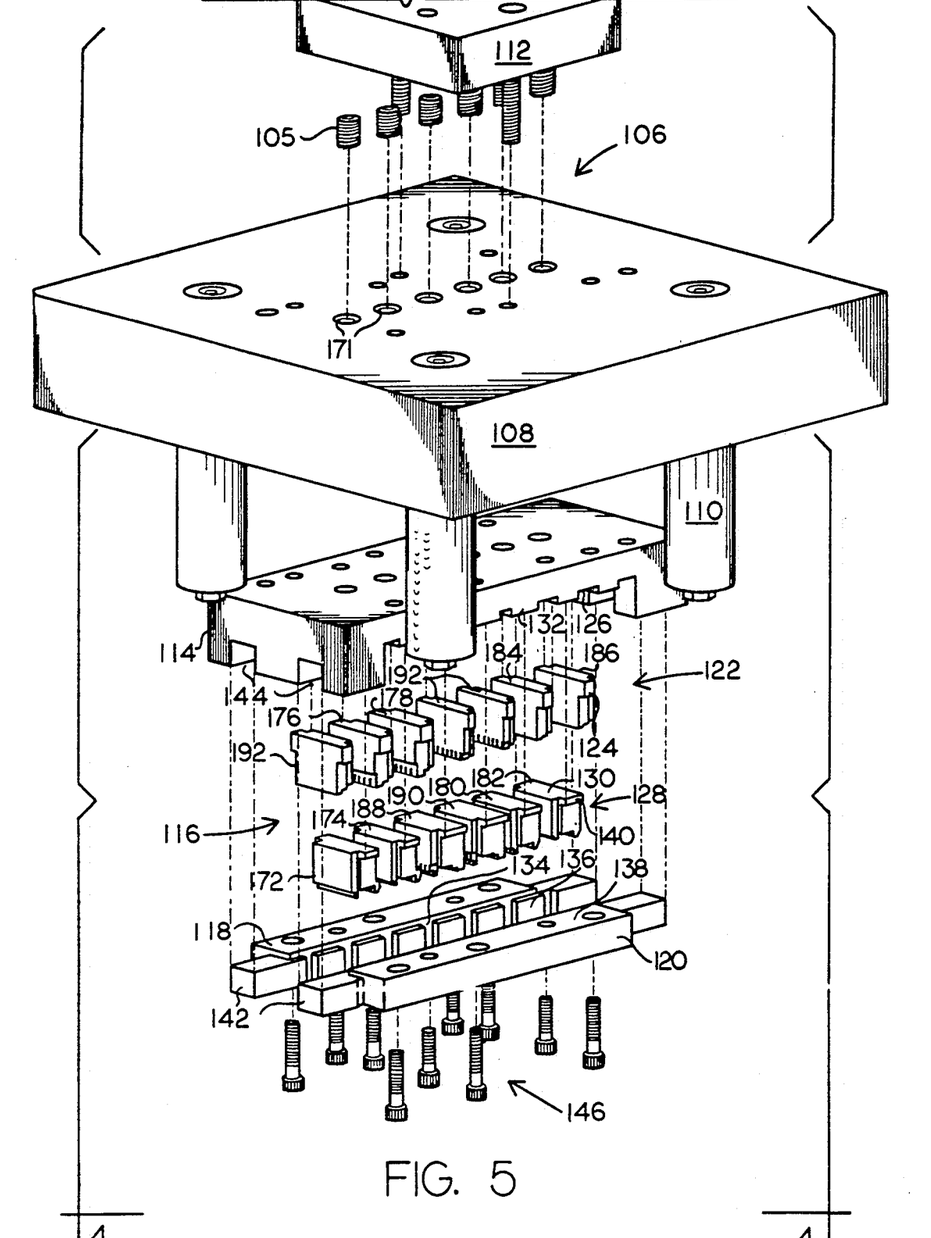
FIG. 5 is an isometric view of the punch assembly of the present invention.

FIG. 5 illustrates the punch assembly 106 of the present invention. The punch assembly comprises a punch holder 108 provided with a plurality of bearing members 110 in the form of ball cages. The bearing members 110 fit within the bushings 74 (FIG. 4) when the punch assembly is in engagement with the die assembly. An hydraulic cylinder adapter plate 112 is securely affixed to the punch holder 108. In much the same manner as described above for the die assembly, the punch assembly is provided with a punch holder chase 114 and a plurality of die 116. A pair of punch holder side plates 118, 120 affix the die 116 to the chase 114. An alternating one-half 122 of the die are similarly provided with a hip portion 124 which is retained within slots 126 milled into the chase 114. The other alternating one-half 128 of the die are provided with a base portion 130 which is retained upon the planar surface 132 of the chase 114. Each of the six die 128 are spring-loaded by spring 171 and set screw 195, similar to the lower die assembly 70. Slots 134 are provided in the side plates 118, 120 to allow for clearance of index pins 92. Die 122 and 128 are retained between the side plates 118, 120. The inward surface 136 and 138 securely retains a lip 140 of the die 128 against the surface 132. When assembled, a pair of protuberances 142 on side plates 118, 120 securely interfit with slots 144 in punch holder chase 114. The entire assembly is held securely in place by a plurality of screws 146. The die 78 are retained in the die assembly in the same manner.

Referring now more particularly to FIG. 4, in a preferred embodiment of the invention there are provided a number of different die in the die assembly. For instance, when manipulating the leads of a 16-lead ZIP package, there are provided a plurality of first form clamps 150 and 152, a plurality of first form punches 154 and 156, a plurality of second form clamps 158 and 160, a plurality of second form punches 162 and 164, a plurality of second form anvils 166 and 168, and a plurality of spacers 170. Each of the first and second form clamps and the second form anvils is spring loaded by spring 171 within the die assembly chase. The spring tension is adjusted by the depth of set screw 105. The die are aligned in-line on the die holder chase 76, and retained thereon by side plates 80, 82. Cooperating with the die retained on the die assembly 70 are a plurality of die retained on the punch assembly 106.

Clamps are provided to prevent damage to the leads and the connection between the leads and package during formation of the bends. Without holding, or restraining, the leads, the leads may be pulled to some degree during bending, thereby possibly damaging the connection between the lead and the internal circuitry. Likewise, by preventing pulling of the lead, damage to the plastic or ceramic package material is avoided.

As shown more specifically in FIG. 5, the punch assembly die include a plurality of first form punches 176 and 178, a plurality of first form clamps 172 and 174, a plurality of second form punches 184 and 186, a plurality of second form clamps 180 and 182, a plurality of second form anvils 188 and 190, and a plurality of spacers 192. In practice, first form clamps from the die assembly and punch assembly cooperate with one another to contain the rectangular package, first form punches from the die (FIG. 4) cooperate with the diametrically opposing first form claim, and the second form anvil cooperates with a second form clamp and second form punch of the opposing assembly (FIG. 4). Each second form anvil is provided with a spacer 192 in order to provide a stationary surface upon which each spring-loaded anvil can slide while isolating the movement of each anvil from the adjacent anvil.

As with the die assembly clamps and anvils, each of the punch assembly clamps and anvils of FIG. 4 are spring loaded within the punch assembly chase in order to securely clamp the leads of each package.

Figure 6:
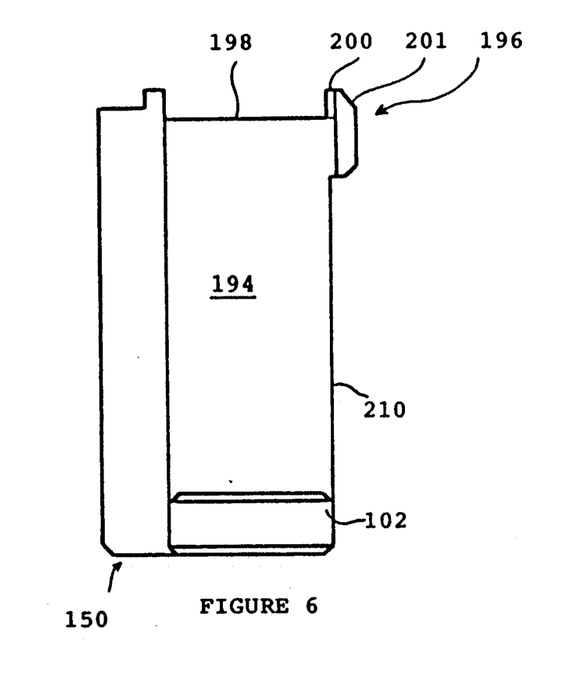
FIG. 6 is a side view of a first form clamp of the present invention.

As illustrated more particularly in FIG. 6, a first form clamp 150 comprises a main-body portion 194 and a cantilevered forming portion 196. The clamp block is provided with a package holding section 198, sized to accept the integrated circuit package with the leads generally co-planar with the upper surface 200 of the cantilevered forming portion 196. The first bend portion 62 of the lead wires is effected by forming the lead wire against the forming surface 201. The angle of the first bend is determined by the angle between surfaces 200 and 201.

Figure 7:
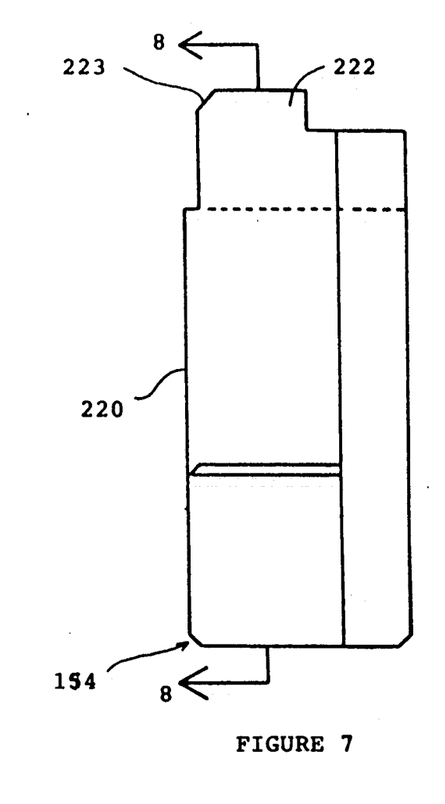
FIG. 7 is a side view of the first form punch of the present invention.
Figure 8:
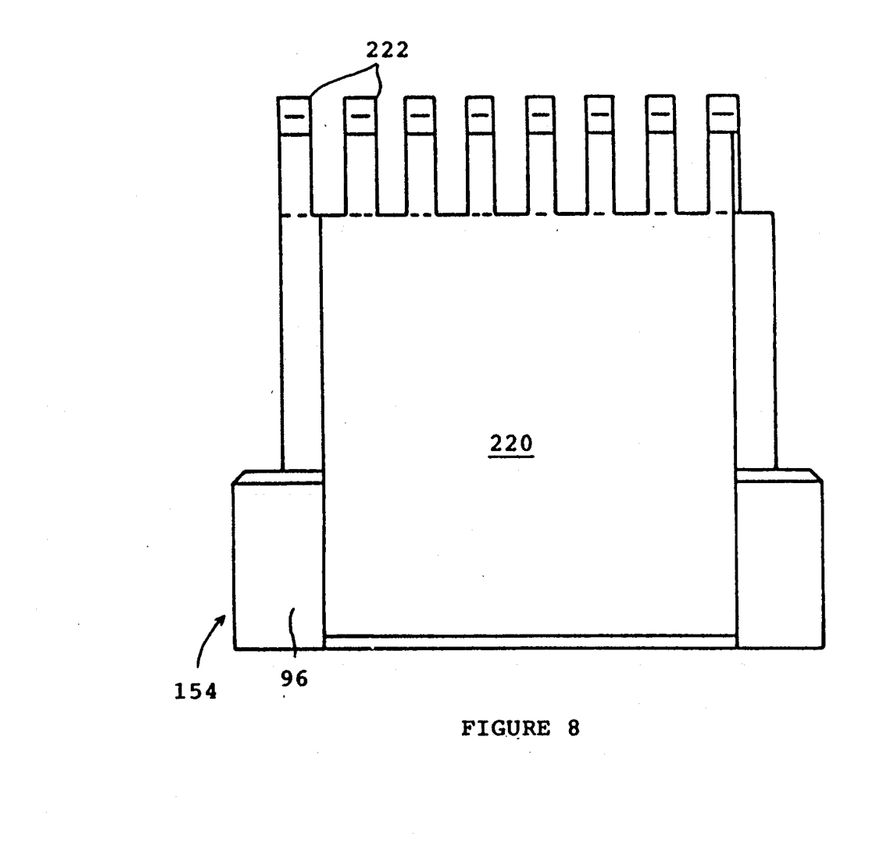
FIG. 8 is a front view of the first form punch of the present invention.

As shown in FIG. 7, the first form punch 154 interfits with the first form clamp 150, with the surfaces 210, 220 adjacent one another and the cantilevered forming portion 196 fitting between the adjacent, separated forming portions 222 of die 154. The angled surface 223 bears against surface 201 and deforms the lead wire in the angle noted, thereby forming the first bend in the lead wires. The second pair of first form clamp and first form punch 152, 156 respectively (FIG. 4), are provided with similar forming portions 196, 222 respectively. In all respects the die 152, 156 are identical to the die 150, 154. The forming portion 223 of the lower punch 154 contacts the forming position 201 of upper first form clamp 172 to form a first bend at 58 as shown in FIG. 2.

Figure 9:
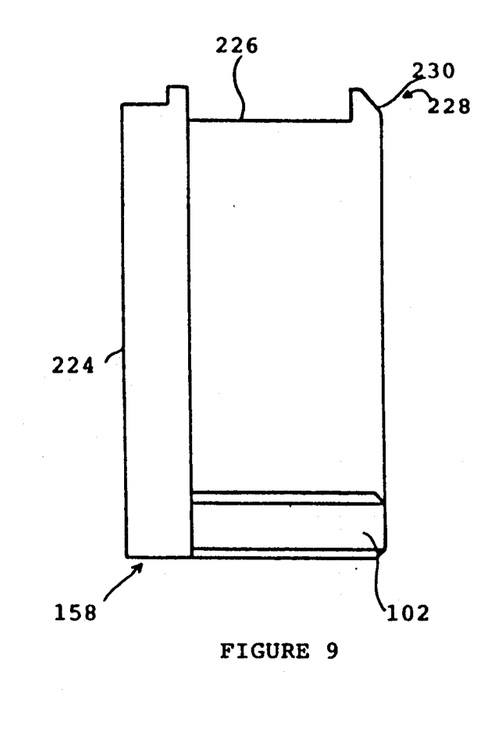
FIG. 9 is a side view of a second form clamp of the present invention.
Figure 10:
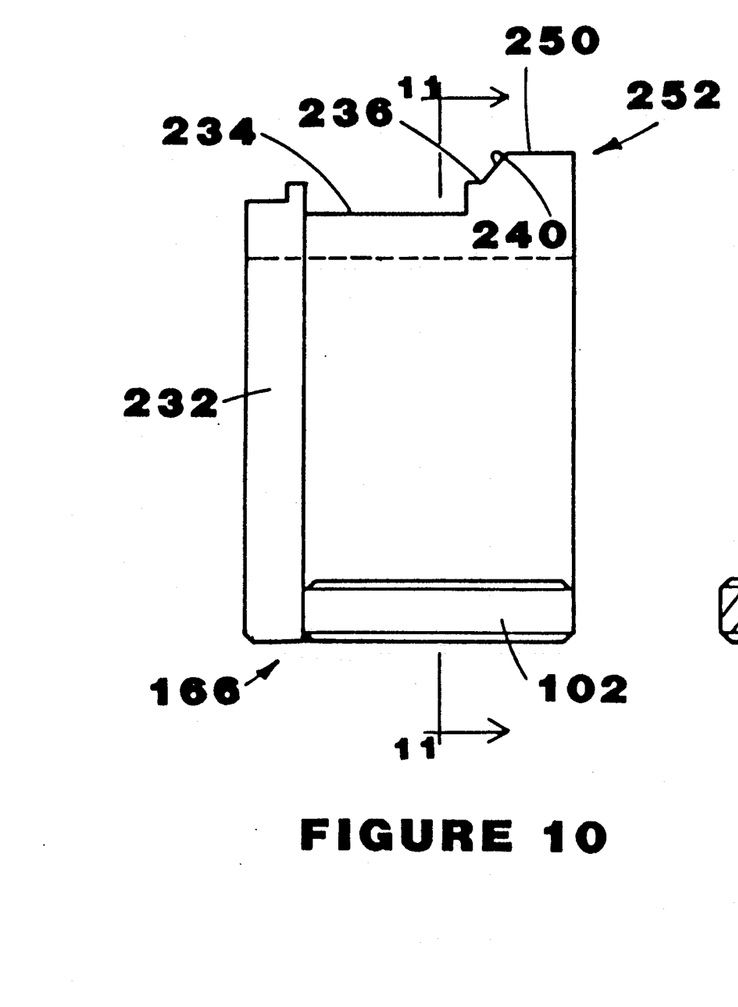
FIG. 10 is a side view of the second form anvil of the present invention.

The second form clamp 158 is shown more particularly in FIG. 9, and comprises a main body portion 224 and an upper surface 226 to receive the integrated circuit package after the first form bend has been made in the lead wires. A supporting portion 228 is provided with a surface 230 which supports the bent lead during the second forming step. The second form anvil 166 (FIG. 10) comprises a main body portion 232 and an upper surface 234 which, in cooperation with the second form clamp 158 securely restrains the integrated circuit package. The surface 236 of anvil 166 mates with the surface of second form clamp 158 (FIG. 9) and retains the first portion 60 of leads 52 therebetween. The angle from horizontal of surface 230 conforms to the angle of the first bend in the lead wires, as dictated by the angle of the first bend induced by surfaces 201, 223 of the first form clamp and first form punch respectively.

Figure 11:
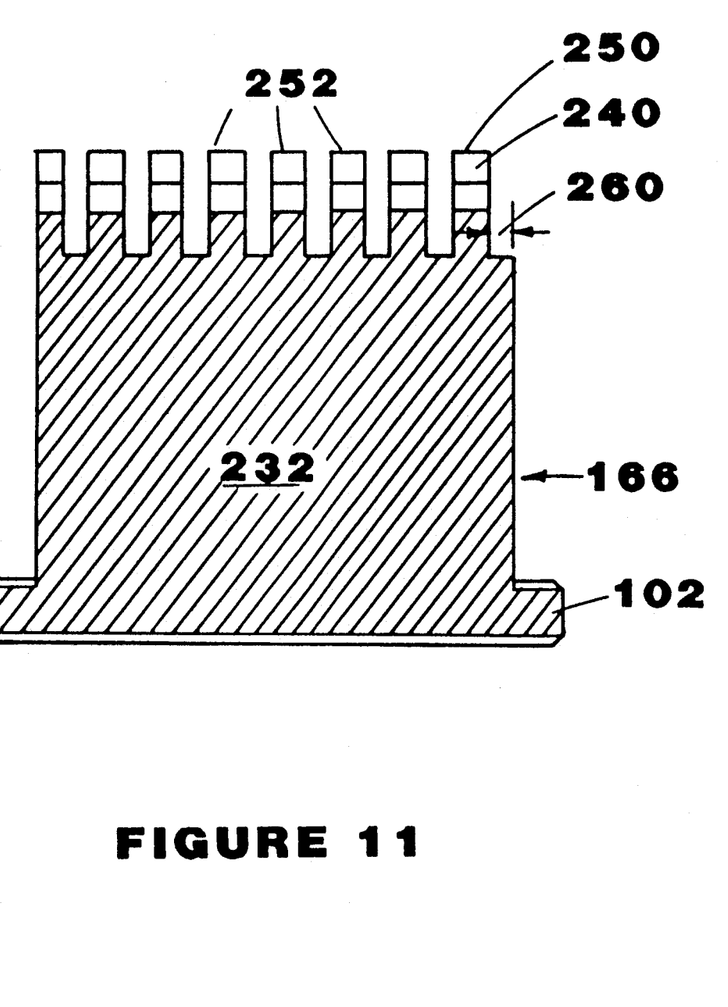
FIG. 11 is a front view of a second form anvil of the present invention.
Figure 12:
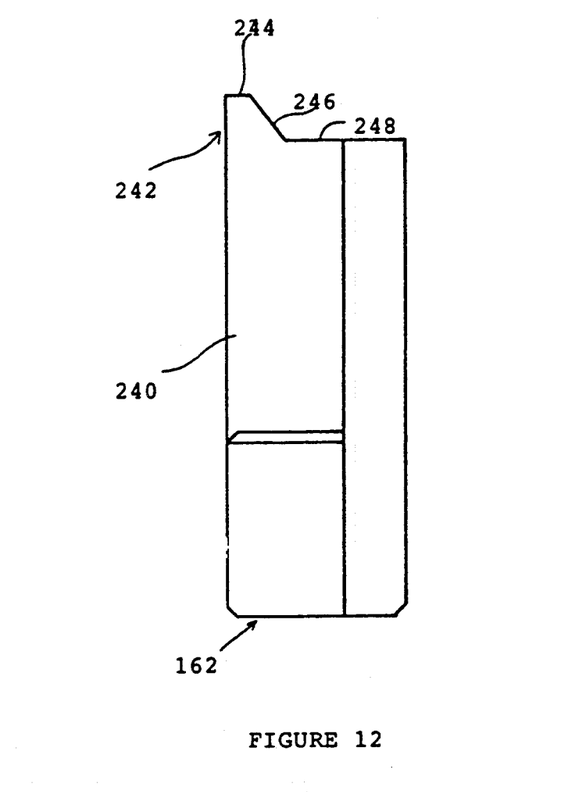
FIG. 12 is a side view of a second form punch in the present invention.

The second form punch 162 (FIG. 12) comprises a main body portion 240 and a forming portion 242. When mated with the second form anvil, a first surface 244 mates with surface 236 of the second form anvil with the leads therebetween. The angled surface 246 provides clearance for leads formed with the first bend prior to forming the second bend. At this point, the first bend has already been provided. The second bend is formed when the planar surface 244 of the second form punch mates with planar surface 250 of the second form anvil. As shown in FIG. 11, a plurality of forming portions 252 on the second form anvil are arranged so a to permit alternating leads to be formed on the forming portions while the other alternating leads are disposed between the portions 252.

Referring again to FIG. 11 it is noted that there is an offset 260 of the forming portion 252. This offset 260 allows a common die to form both odd and even leads, by inversion of the anvil die 166 from the upper punch assembly 106 to the lower die assembly 70. Similar offsets are provided on the first form punches and first form clamps for a like purpose.

The method of operation of the apparatus of the present invention overcomes the disadvantages of the apparatus of the prior art. Referring again to FIG. 1, the scraped metal 30 which is removed from the first portion 20 of the lead can either accumulate at the site of the second bend, thereby distorting the alignment of the second portion 26 when the punch 16 is withdrawn, or it can wear down the punch to the point of inhibiting the ability of the punch to set the second bend by preventing coining of the lead into the anvil. Inconsistently formed lead dimensions is the inevitable result.

The method of the present invention is a three-stage process: first, the first form clamps and punches form the first bend in all of the lead wires simultaneously (with alternating odd and even lead wires being bent in opposite directions); second, all of the odd or even lead wires are provided with a second bend with the second form clamp, second form punch and second form anvil; and thirdly, the alternate one-half (either the odd or the even) of the leads which were not worked in the second stage are provided with the second bend by a second set of second form clamps, punches and anvils. It is to be understood that the numbers of die members of the present invention is significant only insofar as the number of packages to be acted upon at any given moment is concerned, consistent with the requirement that the three stages set forth above are preferably performed simultaneously. In other words, while the method and apparatus of the present invention is disclosed herein (and in the drawings) as acting upon two packages in each of the three stages simultaneously, any number of sets of die could be constructed so as to manipulate any number of die which is a multiple of three.

In practice, a lead frame strip having, for instance, 10 integrated circuit packages in the lead frame may be utilized herein. The lead frames are carried to and through the apparatus of the present invention on a track mechanism (not shown) well known to those familiar with the technology. Such track mechanism can be configured so as to index any number of packages into and through the apparatus at the correct intervals. As disclosed herein, the preferred embodiment utilizes a track indexing mechanism which indexes two parts at a time. Indexing occurs as an hydraulic cylinder (not shown) affixed to the plate 112 of the punch assembly, lifts the entire punch assembly, with the bearings 110 sliding within the bushings 74. Downward movement of the punch assembly die 116 is restrained by the die stops 88 which prevent the die of the die assembly from bottoming on the die of the punch assembly, causing wear and/or damage to the die surfaces. The tube spring 90 retained within the die stops 88 absorbs the hydraulic shock of the punch assembly when it reaches the shutheight.

Lead frame strips are conventionally provided with indexing holes along their lateral edges so that as the lead frame is indexed from station to station, when properly seated, the indexing pin protrudes through the indexing hole of the lead frame. If misalignment has occurred, and the indexing pin bears against the solid metal portion of the lead frame, as the indexing track travels downward, the indexing pin will be likewise depressed, causing the entire apparatus to be shut down. The shut down mechanism may be in any conventional form, such as a grounding mechanism in a normally open electrical circuit.

Figure 13:
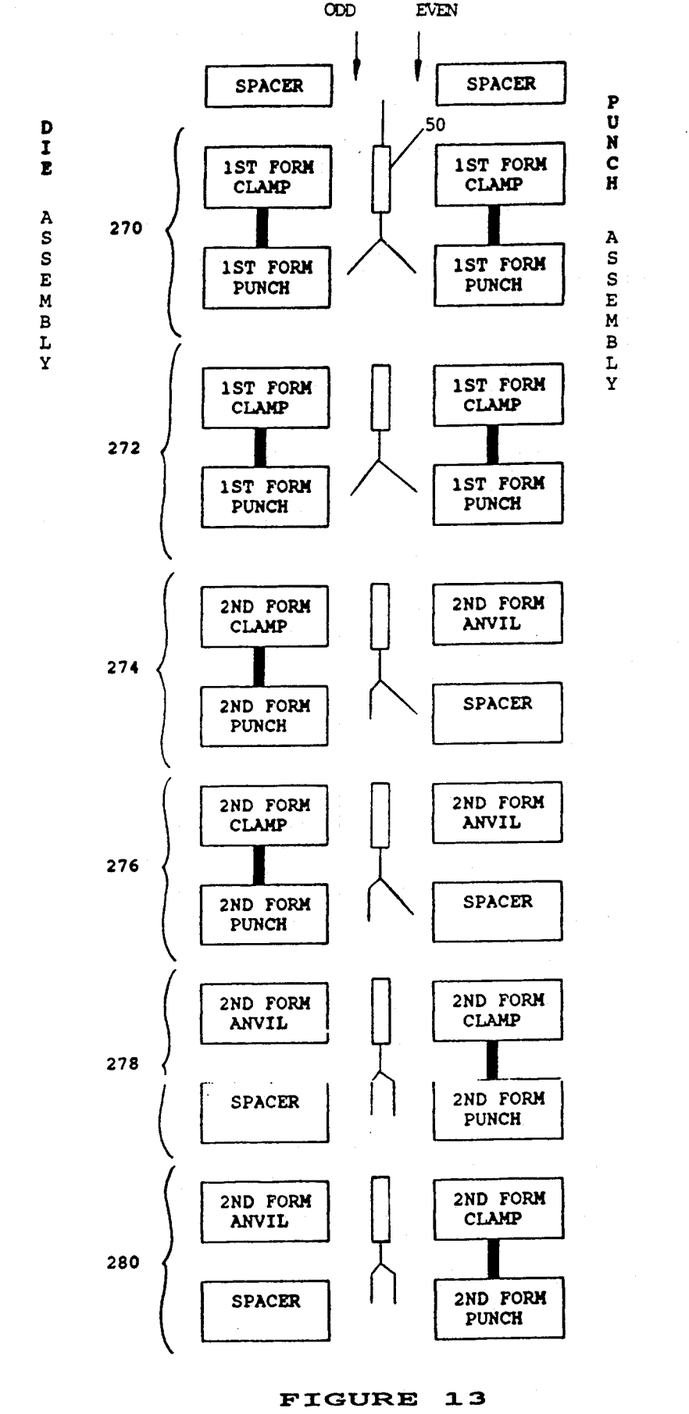
FIG. 13 is a schematic view of the method of the present invention.

By way of example, and as illustrated schematically in FIG. 13, a first set of first form clamps and first form punches 270 interact with one another to form the first bend on all of the leads in a package A. Simultaneously, the first form clamps and punches at station 272 likewise perform first bends on all of the leads of a second package B. In each of the stations 270, 272, the first form punch of the die assembly will form the first bend on all alternating leads in package A (such as leads 1, 3, 5, 7, 9, 11, 13 and 15) while the other first form punch of the punch assembly will perform the first bend on the other alternating half of the leads (such as leads 2, 4, 6, 8, 10, 12, 14 and 16). After the first bends are formed in packages A and B, the hydraulic cylinder retracts the punch assembly, the lead frame is indexed forward two stations and the cycle is repeated. The punch assembly closes on the die assembly with the packages A and B at stations 274, 276 each having alternating one-half of the leads provided with a second bend about the second form anvil. As illustrated, both stations 274 and 276 apply the second bend to the odd-numbered leads. However, one of the stations could be utilized to place the second bend in even-numbered leads (if desired). Simultaneously with the provision of the second bend to one-half of the leads of packages A and B at stations 274, 276, first bends are added to two new packages C and D at stations 270, 272. As the cycle is repeated a third time, the lead frame is indexed forward two stations and the packages A and B previously provided with second bends on one-half of the leads at stations 274, 276 are provided with second bends on the other one-half of the leads at stations 278, 280. Simultaneously, packages C and D are provided with second bends on one-half of the leads at stations 274 and 276, while new packages E and F are provided with first bends at stations 270, 272. Upon preceding through the entire three-stage process, the lead frame is removed from the apparatus and the individual packages thereon are subjected to further processing and testing.

Figure 14:
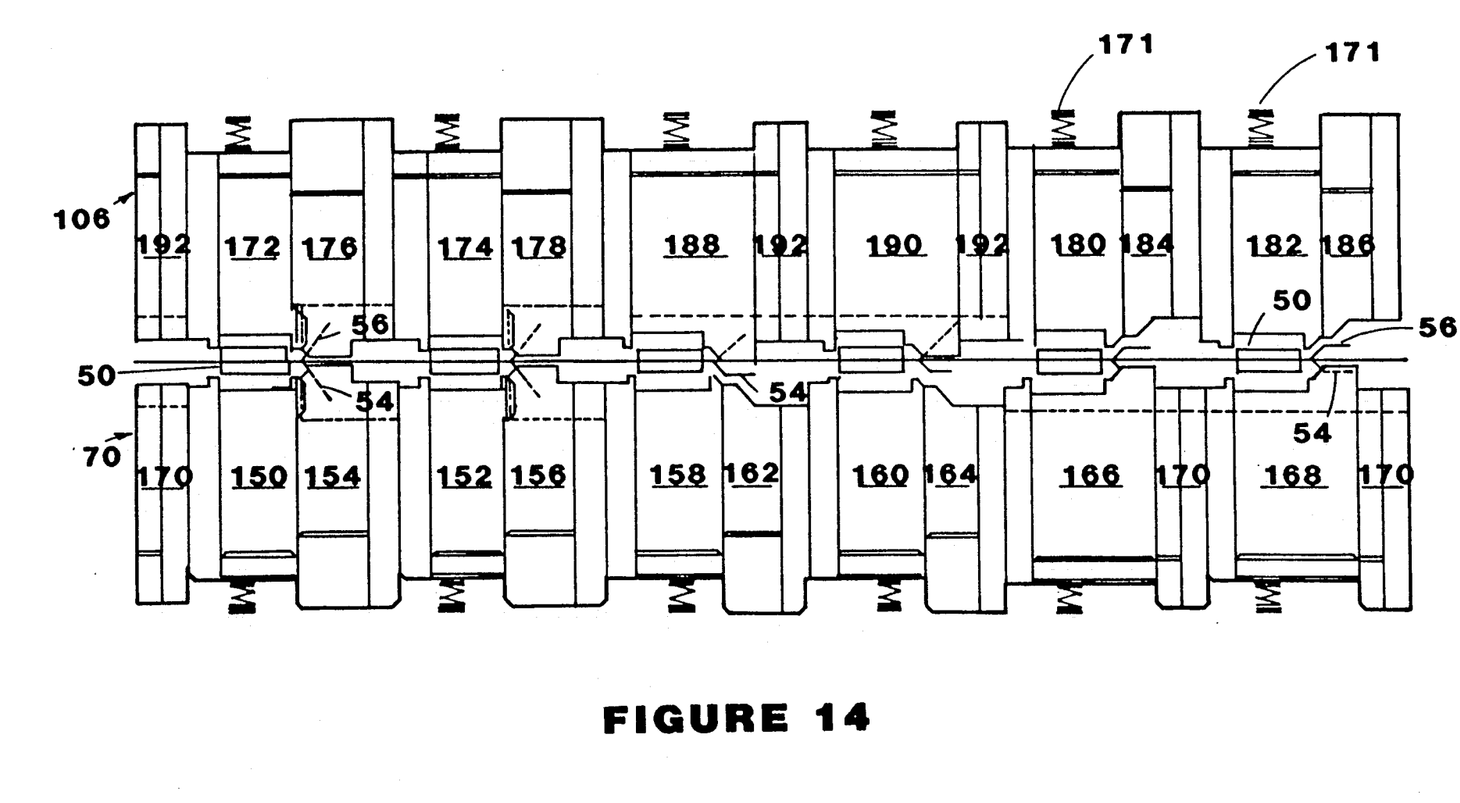
FIG. 14 is a partial elevation view of the punch and die forming tools.

Referring to FIG. 14, the arrangement of the various die and punch tools of FIGS. 4 and 5 and their relationship to the package 50 is illustrated. Lower die assembly 70 and (upper) punch assembly 106 are illustrated in a partially retracted position after forming each of the leads 54, 56 on each package 50.

In the illustration punch 154 has completed a first stage bend of lead 56 in cooperation with a mating surface on first clamp 172. At the same stroke (upper) punch 176 has formed lead 54 on a surface of first clamp 150. The clamps 150 and 172 have just released package 50 from the package holding section 198. Springs 171 (schematically shown) are provided on each first form clamp 172, 174, 150 15; each second form anvil 188, 190, 166, 168; and each second form clamp 158, 160, 180 and 182.

At the second stage, second form anvil 188 and second form clamp 158 a second bend has been formed on lead 54 by the combined surfaces of punch 162 and clamp 158 in cooperation with anvil 188. In a similar manner lead 56 has a second bend formed at the third stage.

Figure 15:
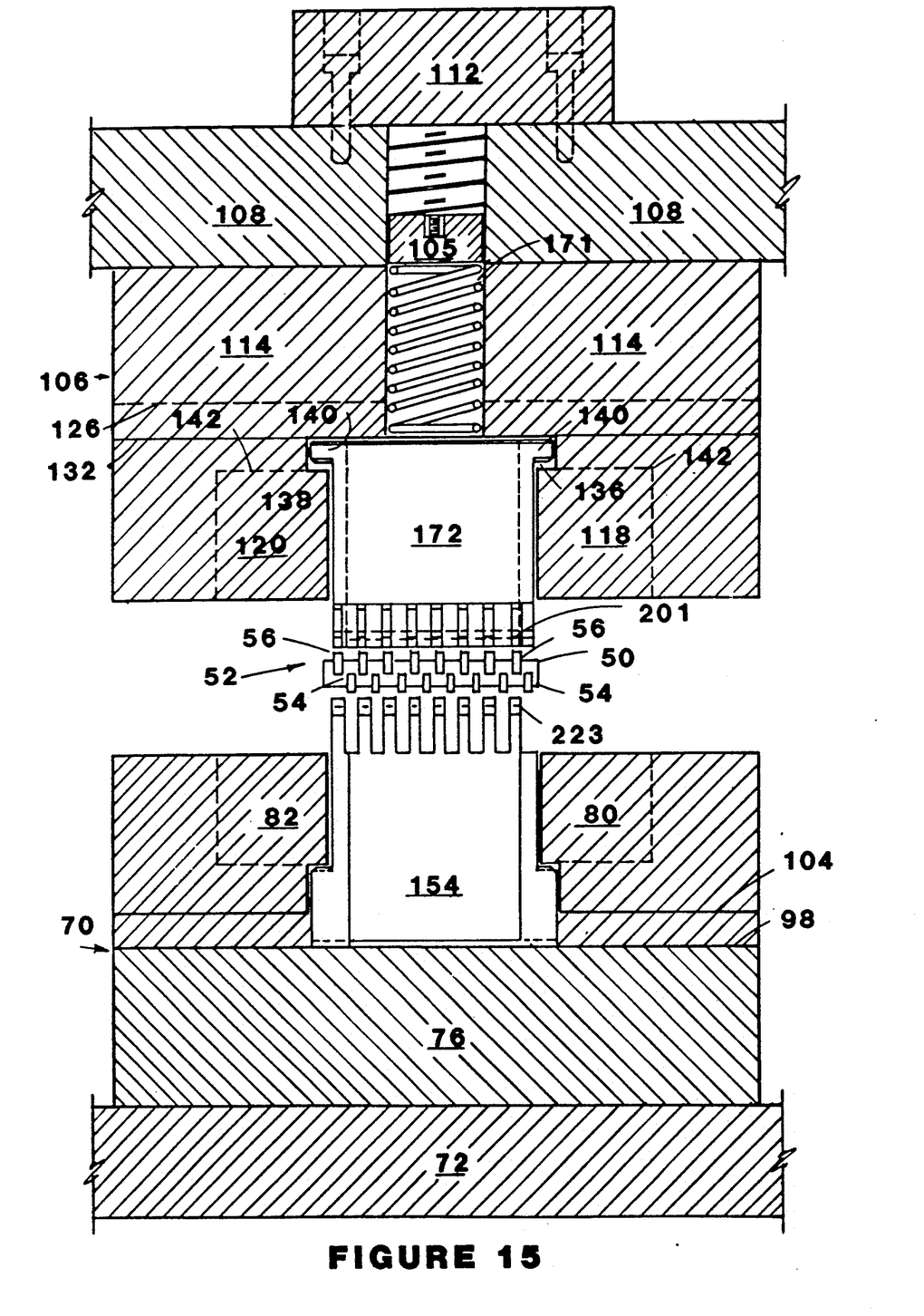
FIG. 15 is a partial section view of the present invention.

FIG. 15 illustrates in section view, the arrangement of the major component of the present invention. Hydraulic cylinder adapter plate 112 is affixed to punch holder 108 which in turn is secured to punch holder chase 114. Side plates 118 and 120 are also affixed to chase 114 and restrain the first form clamp 172 at tip 140. Spring-loading is provided by spring 171 and set screw 105 and there is a small degree of freedom between surfaces 136, 138 and the tip 140.

The die assembly 70 consists essentially of the base plate 72 affixed to die holder chase 76. In a manner similar to the punch assembly 106, the first form punch 154 is restrained against the chase 114 by a pair of side plates 80, 82 except that the punch 154 is held securely against the base of slot 98 within chase 76 and is not spring-loaded.

In this section view, the odd leads 56 have been first formed up by the cooperating surfaces 223 of first form punch 154 with the surface 201 of the first form clamps 172. In a similar manner leads 54 are formed down by interaction of adjacent punch 176 and clamp 150 (FIG. 14).

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

I claim:

1. In an apparatus to produce bends in the lead wires of a multiple in-line lead intergrated circuit package contained in a lead frame comprising a cooperating die assembly and punch assembly, the improvement comprising:
   (a) a plurality o first pairs of cooperating clamps and punches on each of the respective die assembly and punch assembly adapted to make a first bend simultaneously on each of said lead wires;
   (b) a plurality of second pair of cooperating punches and anvils on each of the respective die assembly and punch assembly adapted to make a second bend in an alternating one-half of said lead wires;
   (c) a plurality of pairs of cooperating punches and anvils arranged opposite from those of step (b) and adapted to form a second bend in the other alternating one-half of said lead wires; and
   (d) means to index the package through the apparatus such that the first bend and the second bend are formed sequentially on said lead wires.

2. The apparatus as recited in claim 1 and wherein the packages are indexed two packages at a time.

3. The apparatus as recited in claim 1, wherein said first bend is formed simultaneously on each of said lead wires such that alternating lead wires are bent an opposite directions to one another by adjacent pairs of cooperating clamps and punches.

4. The apparatus as recited in claim 3, wherein said second bend is formed on alternating lead wires sequentially, such that all of said lead wires bent in a first direction are provided with said second bend simultaneously, and thereafter each of said lead wires bent in a second direction are provided with said second bend simultaneously.

5. A three-step method of forming multiple bends in a plurality of longitudinally aligned lead wires of a multiple in-line lead integrated circuit package, comprising the steps of:
   (a) feeding a plurality of packages affixed one to the other through a die punch apparatus;
   (b) forming a first bend on each of the lead wires of a package simultaneously;
   (c) forming a second bend in an alternating one-half of the lead wires of step (b);

(d) forming a second bend in the remaining alternating one-half of the lead wires not formed in step (c); and forming of the first and second bend is by deforming the lead wires between a first and second form punch means respectively located on a die assembly and a first and second form clamp means located on a punch assembly.

6. The method as recited in claim 5, further comprising the step of restraining the lead wires between clamp means located on the die assembly and clamp means located on the punch assembly.

7. The method as recited in claim 5, further comprising the step of forming the second bend on said first one-half of the lead wires by deforming the lead wires between punch means located on the die assembly and anvil means located on the punch assembly.

8. The method as recited in claim 7, further comprising the step of forming the second bend on the remaining one-half of the lead wires by deforming the lead wires between punch means located on the punch assembly and anvil means located on the die assembly.

9. The method as recited in claim 7, further comprising the step of spring-loading the anvil means.

10. The method as recited in claim 5, further comprising the step of sensing a misfeed of said packages within said apparatus and preventing subsequent forming steps until the misfeed is corrected.

11. The method as recited in claim 5, further comprising the step of forming the first and second bends in the lead wires without causing measurable metal scraping of the lead wires.

* * * * *